United States Patent
Wohl et al.

(10) Patent No.: US 9,171,123 B2
(45) Date of Patent: Oct. 27, 2015

(54) DIAGNOSIS AND DEBUG USING TRUNCATED SIMULATION

(71) Applicant: Synopsys, Inc., Mountain View, CA (US)

(72) Inventors: Peter Wohl, Williston, VT (US); John A Waicukauski, Tualatin, OR (US); Emil Gizdarski, Cupertino, CA (US); Wolfgang Meyer, Campbell, CA (US); Andrea Costa, Le Touvet (FR)

(73) Assignee: Synopsys, Inc., Mountain View, CA (US)

( * ) Notice: Subject to any disclaimer, the term of this patent is extended or adjusted under 35 U.S.C. 154(b) by 126 days.

(21) Appl. No.: 14/015,982

(22) Filed: Aug. 30, 2013

(65) Prior Publication Data

US 2015/0067629 A1    Mar. 5, 2015

(51) Int. Cl.
*G06F 17/50*    (2006.01)

(52) U.S. Cl.
CPC ........ *G06F 17/5081* (2013.01); *G06F 17/5022* (2013.01)

(58) Field of Classification Search
None
See application file for complete search history.

(56) References Cited

U.S. PATENT DOCUMENTS

| | | |
|---|---|---|
| 7,440,882 B1 | 10/2008 | McLennan |
| 7,590,518 B2 | 9/2009 | Phillips |
| 7,814,444 B2 | 10/2010 | Wohl et al. |
| 7,823,034 B2 | 10/2010 | Wohl et al. |
| 7,840,862 B2 | 11/2010 | Huang et al. |
| 7,882,410 B2 | 2/2011 | Ayres et al. |
| 7,958,472 B2 | 6/2011 | Wohl et al. |
| 7,979,763 B2 | 7/2011 | Wohl et al. |
| 8,290,761 B1 | 10/2012 | Singhee et al. |
| 8,429,473 B2 | 4/2013 | Wohl et al. |
| 2008/0256274 A1 | 10/2008 | Wohl et al. |
| 2008/0256497 A1 | 10/2008 | Wohl et al. |
| 2008/0320348 A1 | 12/2008 | Ayres et al. |
| 2010/0083199 A1 | 4/2010 | Wohl et al. |
| 2010/0100781 A1 | 4/2010 | Wohl et al. |
| 2011/0231805 A1 | 9/2011 | Wohl et al. |
| 2011/0258503 A1 | 10/2011 | Wohl et al. |
| 2012/0185223 A1 | 7/2012 | Wu |
| 2013/0185046 A1 | 7/2013 | Bagheri et al. |

*Primary Examiner* — Leigh Garbowski
(74) *Attorney, Agent, or Firm* — Adams Intellex, PLC (57) ABSTRACT

Patterns used to detect a failure in a semiconductor chip are analyzed to determine a subset of logic in a design where a semiconductor chip, fabricated based on the design, contains a fault in the subset. Parts of the semiconductor chip can be pre-calculated to identify a key subsection of logic, based on the patterns, with that subsection being stored in a computer readable file. Good-machine simulation is performed on the subsection of logic using truncated rank-ordered simulation. The results are compared to the results of the testing of the physical semiconductor chip.

33 Claims, 11 Drawing Sheets

DIAGNOSIS AND DEBUG USING TRUNCATED SIMULATION

FIELD OF ART

This application relates generally to semiconductor design and more particularly to diagnosis and debug of a semiconductor design using truncated simulation.

BACKGROUND

With large and complex semiconductor designs including hundreds of millions of transistors common in modern applications, the importance of accurately designing, debugging, and fabricating such large, complex designs becomes paramount. A wide variety of electronic computer-aided design tools have been deployed to aid in the process. Examples of some of the tools that have been used include schematic capture tools, hardware synthesis tools, formal verification tools, physical layout tools, and various simulation tools.

Simulation can occur at various conceptual levels for the semiconductor design. In some cases, a functional simulation is performed based on a functional description of the design. A digital simulation of the gate-level functionality can also be performed. The digital simulation can include timing analysis either during an initial or subsequent pass through a simulation process. In some cases, a full analog simulation can be performed, with this analog simulation typically only performed on a few key nets, such as clock lines, memory sense amplifiers, etc. In some cases, analog simulation can, however, be performed on a full design.

The results of the various simulations are used to determine if the design is working as intended. This process can be referred to as debugging the design. Various test vectors are developed to use in testing a manufactured integrated circuit (IC) fabricated from the design.

Diagnosing test failures of manufactured integrated circuits can help to increase yield enhancement and/or ramp up a new process. Simulation is helpful in diagnosing the test failures that occur, as probing actual failing parts to determine the cause of the failure may be difficult. However, diagnosis of large designs using simulation can require significant CPU time and very large memory usage, thus becoming very costly. Similarly, debugging simulation failures of large designs can also require significant CPU time and very large memory usage.

SUMMARY

Test patterns are used to detect failures in a semiconductor chip and to determine a cone or subset of logic in the design that contains a possible fault causing the failure. Parts of the semiconductor chip are pre-calculated to determine a list of gates. This list of gates is simulated using good-machine simulation with the pre-calculated list of gates being stored as in computer readable file. The good-machine simulation is used to compare with testing results from a physical semiconductor chip.

A computer-implemented method for design analysis is disclosed comprising: obtaining a design and patterns used to test the design; determining one or more of the patterns which cause a physical semiconductor chip, based on the design, to fail in operation; identifying a subset of logic within the design based on the one or more patterns which cause the physical chip to fail in operation; generating a truncated rank-ordered list based on the subset of logic; and performing good-machine simulation on the subset of logic using the one or more patterns and the truncated rank-ordered list. In embodiments, the truncated rank-ordered list includes a list of pass-through cells where the list of pass-through cells includes state elements which data passes through during application of the one or more patterns.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Configuration Overview:

While simulation is a useful tool for debugging defects in semiconductor chips, as the chips have grown larger, the computational resources needed to simulate those chips have grown as well. In many cases, the time to simulate the entire chip can take long enough that it is not feasible to use the simulation in an interactive debug environment. In one recent example, a design image was over 80 gigabytes (GB) in size and simulating one pattern required almost 40 seconds of CPU time. A test engineer can work with a design to create a hypothesis as to what type of defect could have caused an error and to generate a set of patterns which can then be run in a simulation of the design to see if it matches the results of the defective chip. But developing and testing such a hypothesis can prove very difficult and time consuming for the test engineer.

Further, a single error is often limited to a fairly small set of observation points and the error is typically verified using a small number of test patterns. The set of test or observation points that are found to be incorrect in the defective chip can be used to identify a cone or subset of logic in the design that corresponds to the portion of the chip that likely contains the defect causing the incorrect output(s). The parts of the design inside of that subset of logic can be used to pre-calculate lists of gates, and stored once for reuse many times. This saves significant computing resources.

To simulate a pattern, pre-calculated lists of gates for the design are retrieved and used to simulate the pattern. This simulation requires far fewer computing resources than simulating the entire design. In the 80 GB example discussed above, such a technique was found to reduce the CPU time to simulate one pattern from almost 40 seconds to less than 150 milliseconds (ms), not including the pre-calculation time.

Even considering the pre-calculation time, the pre-calculated data can be used many times to simulate many different patterns, thus reducing the overall time to debug the defect dramatically in some embodiments. Because the pre-calculated lists of gates are usually a small portion of the entire chip, the computational resources required to simulate the subset of logic are much smaller than those required to simulate the entire chip, especially across large chips.

Patterns can be identified to be used in the debugging process. In some cases, the patterns can be identified based on testing of one or more defective semiconductor chips. In other cases, the patterns are identified based on test coverage or other metrics, before the actual testing of physical parts. The patterns can be one-clock patterns, two-clock patterns, and/or longer patterns, depending on the embodiment.

Once the patterns have been identified, one or more subsets of logic can be determined based on the patterns. The observation points for the pattern are traced back by the number of clocks of the pattern to stimulus points to determine a subset of logic. The subset of logic is stored as a separate truncated netlist.

To perform the simulation for debugging, the subset of logic containing the test point showing the error is identified. The pattern that failed during the test of an actual defective semiconductor chip is determined. The truncated netlist for that subset of logic is retrieved and simulated using pre-computed results for the pattern from the design. By using the smaller subset of logic in the simulation, the computing resources required can be reduced significantly as compared to simulating the entire design.

In some embodiments, patterns with a single clock cycle are used. Circuitry is traced back from selected observation nodes for the pattern such that a gate, or circuit element, is traced only one time. If a circuit element is a state element, such as a latch or flip-flop, that is not transparent, that state element can be considered part of a boundary cell list. In some cases, the circuit state element can be placed in a pass-through cell list. Circuitry is traced back from the state elements in the pass-through cell list such that a gate continues to be traced only one time until a state element that is not transparent is detected. Those state elements are then placed in the boundary cell list. The circuitry that was traced from the selected observation nodes to the boundary cell list, along with the pass-through cell list, is considered to be the subset of logic for that pattern. Patterns with multiple clocks can be handled in a similar manner, repeating for the number of clocks of the test pattern to create the subset of logic.

To simulate the truncated design, the state elements in the boundary cell list are initialized. The initialization is based on the pre-computed results stored for the rest of the design based on the pattern. If scan compression is used in the design, the load compressor output values are calculated only for the scan cells within the boundary cell list. The gates in the truncated netlist representing the subset of logic are then simulated. In at least one embodiment, the gates in the truncated netlist are simulated in the order in which they appear in the truncated netlist and the state elements in the truncated netlist (the pass-through cell list and the selected observation nodes) are then simulated, with the number of state elements that change states noted. The simulation steps are then repeated until either no state elements change or until a maximum activity threshold is reached. If a multiple clock pattern is being simulated, the boundary cell list is updated with values based on the pre-computed results, and the simulation of the gates and state elements in the truncated gate list is repeated.

Figure 1:
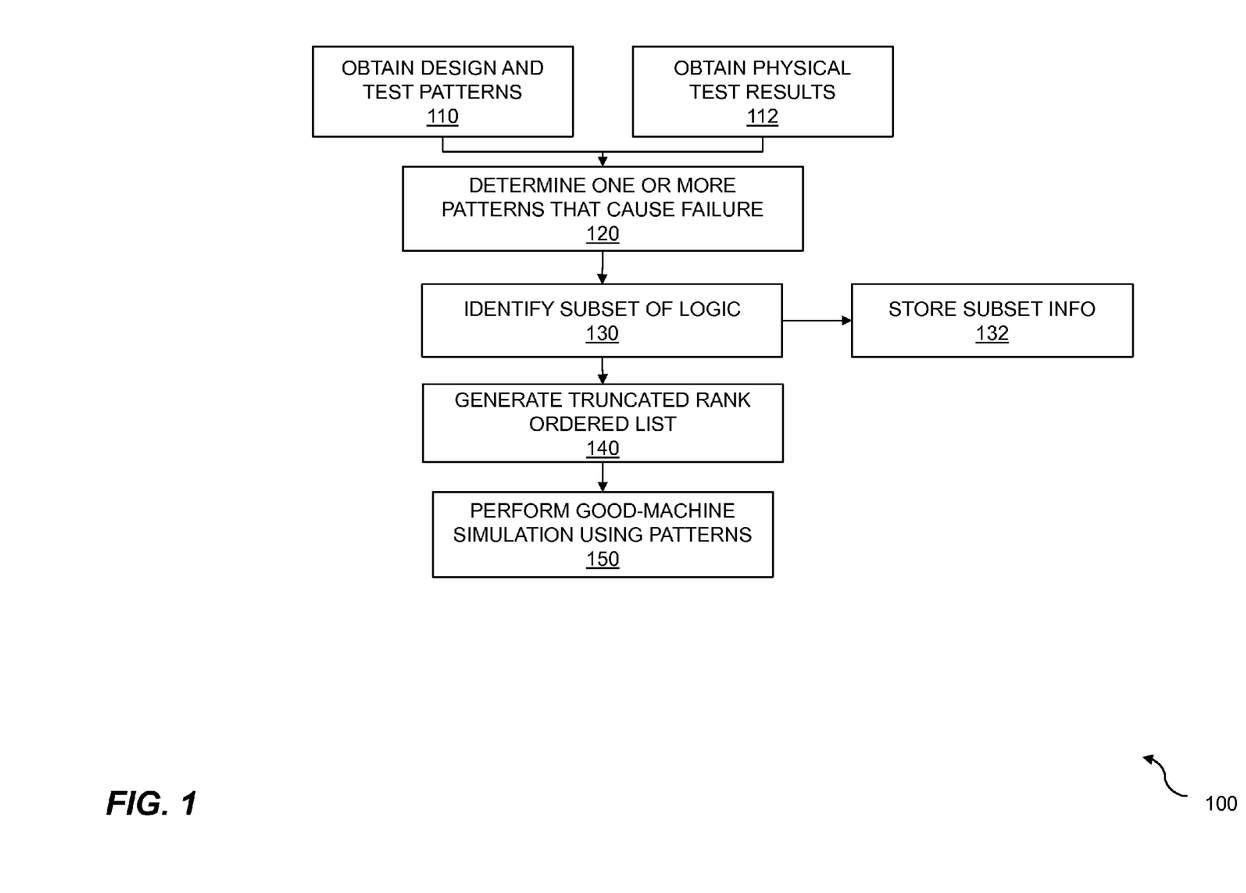
FIG. 1 is a flow diagram for a method for logic subset identification and simulation.

Further Details:

FIG. 1 is a flow diagram for subset identification and simulation. The flow 100 describes a computer-implemented method for design analysis. The flow 100 includes obtaining a design and patterns used to test the design 110. The design and pattern can be obtained by numerous methods but are read from a data file stored on a computer readable storage medium, in some embodiments. The design may be described using a design description language. Some design description languages are defined as a hardware description language (HDL) such as Verilog™, SystemVerilog™, or VHDL™. In other embodiments, the design is described as a netlist that shows connections between cells defined within a cell library. In other embodiments, the design can be described by some other high-level language, such as Java, C, C++, or SystemC. The design can be described by a set of masks which describe a physical design, in some embodiments.

The flow 100 also includes obtaining physical test results 112. The results may be from a test of a prototype integrated circuit (IC), which may alternatively be referred to as a semiconductor chip, a production manufacturing environment testing newly manufactured ICs, a failure analysis lab determining a root cause of a failure of an IC that failed in the field, or from any other source. The results may include one or more failures. A failure may be determined by finding one or more outputs of the IC, and/or one or more registers internal to the IC, that evidence an unexpected state in response to a set of one or more test vectors. The results may include the one or more patterns which caused the failures, and the semiconductor chip may have a defect which causes the one or more patterns to fail on the physical semiconductor chip. The patterns may include a one-cycle pattern, a two-cycle pattern, or a pattern with a higher number of cycles. A one-cycle pattern is a single test pattern where input stimulus is clocked through logic, under test, to observation points in a single clock cycle. A two-cycle pattern is a pattern where input stimulus is clocked through logic, under test, to observation points in two clock cycles. Once a failure has been found, the set of one or more test vectors, or patterns, that caused the failure, may be identified. So, the flow 100 includes determining one or more of the patterns which cause a physical semiconductor chip, based on the design, to fail in operation 120.

The one or more outputs of the IC and/or one or more registers internal to the IC that show the failure when tested are then used to identify a subset of logic 130 in the design. The outputs and/or registers may be referred to collectively as the failed observation points. In at least some embodiments, the failed observation points may be accessed using one or more shift chains in the IC. The subset of logic is the set of logic that has the ability to impact the state of the failed observation points based on a set of inputs of the IC and/or one or more registers internal to the IC that can be controlled, which may be referred to collectively as stimulus points. In at least some embodiments, the stimulus points may be accessed using one or more shift chains, which may be the same shift chains or different shift chains than the shift chains used to access the failed observation points. The subset of logic may include the failed observation points, the stimulus points that may be used to generate the failure, and the circuitry that is logically between the stimulus points and the failed observation points. The subset of logic within the design can be identified based on the one or more patterns which cause the physical chip to fail in operation.

Once the subset of logic has been identified, the subset of logic within the design as well as information on the subset of logic along with the one or more patterns may be stored 132. This information may be stored as one or more files on a computer readable storage medium, or in some other manner, depending on the embodiment. The subset of logic may include a truncated netlist, so that the full netlist of the design is not included in the stored subset of logic.

The flow 100 includes generating a truncated rank-ordered list 140 based on the subset of logic. The rank-ordered list can indicate the order in which the gates or blocks within the subset of logic are to be simulated. The lower-numbered gates or blocks are simulated first. This rank order simulation means that, by the time that a gate or block is to be simulated, all of the inputs to the gate or block have already been evaluated since those come from gates or blocks with lower rank orders. In embodiments, the truncated rank-ordered list includes a list of selected observe nodes. Observe nodes are nodes which include scannable cells where pattern failures can be observed. One or more patterns may fail for a group of the selected observe nodes or all of the selected observe nodes. In some embodiments, the truncated rank-ordered list includes a list of pass-through cells. The pass-through cells include state elements for which data transparently passes through during application of the one or more patterns. In embodiments, the truncated rank-ordered list includes a truncated state elements list. The truncated state elements list can include a list of selected observe nodes and a list of pass-through cells. The truncated rank-ordered list can include a list of boundary cells where the list of boundary cells includes stimulus points used by the one or more patterns. The flow 100 also includes performing good-machine simulation on the subset of logic using the one or more patterns 150 and the truncated rank-ordered list. The good-machine simulation can be performed on the subset of logic without any faults added to the design, therefore, the good-machine simulation should pass when the one or patterns are applied to the design. In embodiments, the good-machine simulation is performed using rank order simulation based on the rank-ordered list. In some cases, multiple passes of the rank order simulation can be performed where a subset of logic includes a feedback path.

The flow may further comprise comparing the good-machine simulation with test results from the physical semiconductor chip. Because the physical IC has failed and the good-machine simulation includes no faults added to the design, the outputs of the two should be different. If the results are different, further analysis may be performed using simulation on the subset of logic, such as inserting faults to attempt to diagnose the defect in the physical IC. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
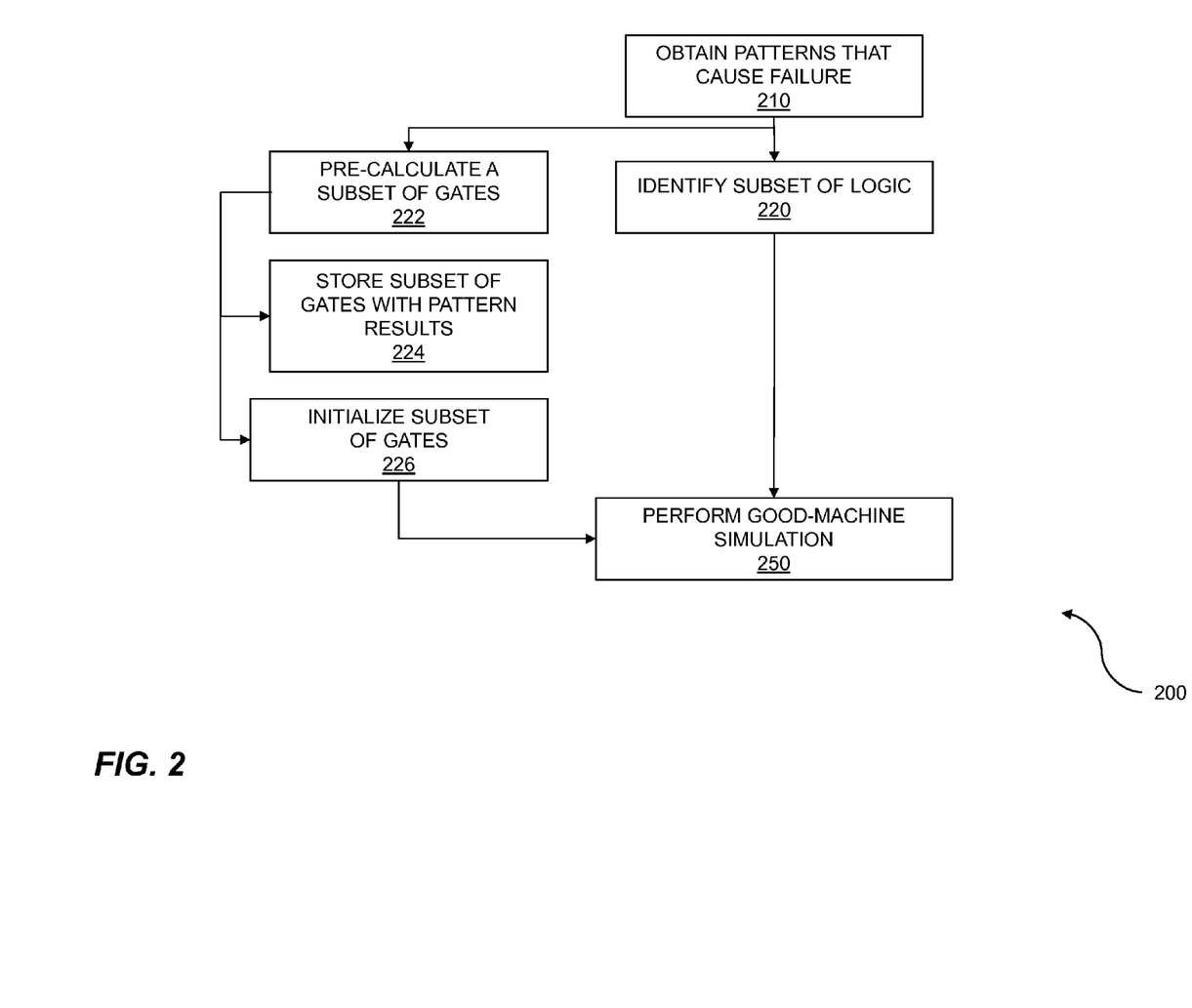
FIG. 2 is a flow diagram for performing simulation.

FIG. 2 is a flow diagram for performing simulation. The flow 200 includes obtaining patterns that cause a failure in a semiconductor chip 210. The failure may be determined from a single semiconductor chip that has failed, or may be based on testing a large number of physical ICs. The patterns may include a first set of patterns that cause a first failure and another set of patterns that cause a second failure. The first failure and the second failure may have one or more failed observation points in common in some cases.

The flow 200 continues by identifying a subset of logic 220. The subset of logic may be identified similarly to that described above. The subset of logic may be based on a rank-ordered list of gates. The rank ordering can be used to ensure certain gates or blocks of lower rank are simulated before other gates or blocks of higher order. The flow 200 also includes pre-calculating a subset of gates within the design based on a given pattern 222. The subset of gates may include gates of the design outside of the subset of logic. The patterns that cause the failure(s) may be applied to the subset of gates and the subset of gates simulated to determine how the subset of gates reacts to the failure-inducing patterns. The subset of gates from the pre-calculating may then be stored 224 in a computer readable format. In some embodiments, a plurality of subsets of gates may be pre-calculated.

Before a simulation is run, the subset of gates may be initialized 226 by reading the stored subset of gates to put those gates into a known state. This may reduce the amount of computing resources that are required as compared to re-running the simulator with the full set of gates for each pass of the good-machine simulation. Then good-machine simulation may be run 250. Thus, the performing good-machine simulation may include initializing a subset of gates within the design. The good machine simulation includes performing good-machine simulation on the subset of logic and/or performing good-machine simulation on the second subset of logic. In some embodiments, the subset and the second subset may be combined into a combined subset and good-machine simulation may be performed on the combined subset. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
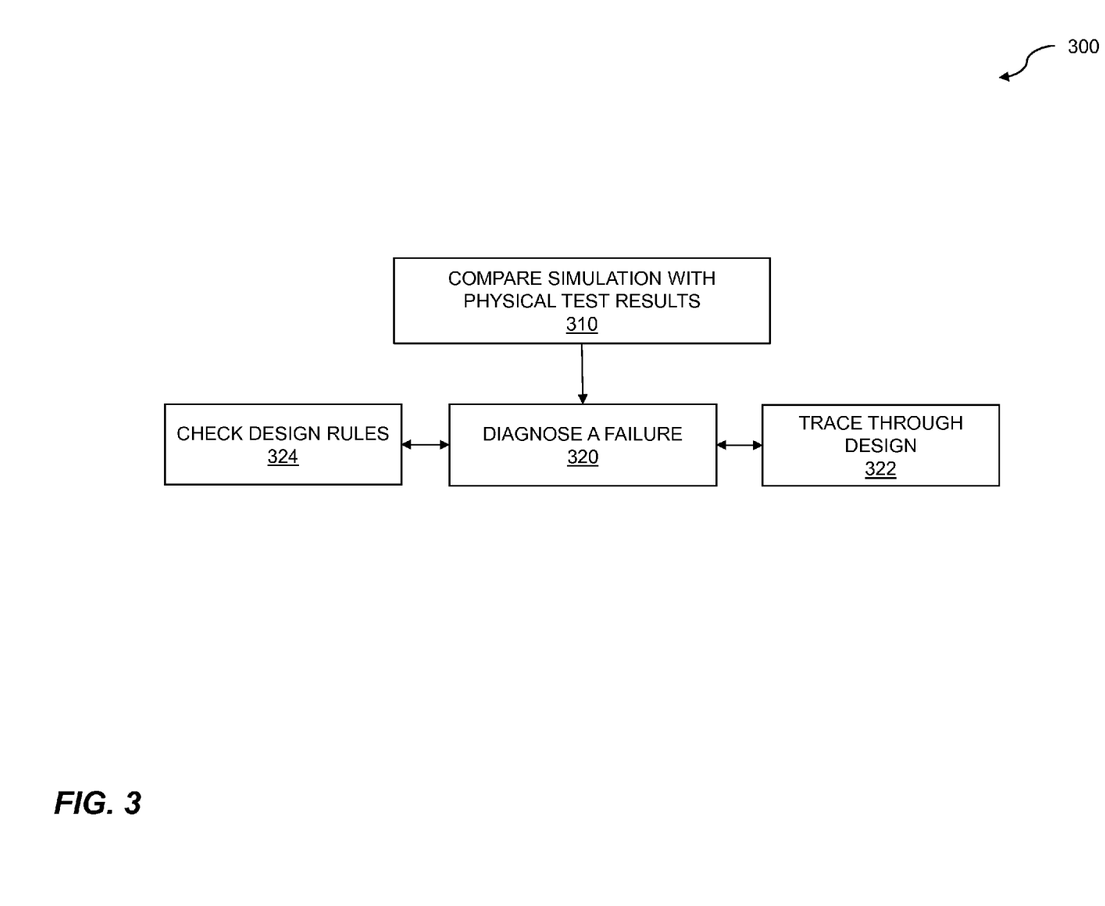
FIG. 3 is a flow diagram for diagnostic analysis.

FIG. 3 is a flow diagram for diagnostics analysis. The flow 300 starts with comparing a simulation with physical test results 310. The comparing may be based on one or more patterns that are used in both the simulation and the physical test. As the test is performed on a physical chip containing a defect, the output of the testing of a correct logic design may differ from the output of the physical, defective chip under test. The flow 300 continues with diagnosing a failure on the physical semiconductor chip based on the comparing 320. Diagnosing the failure may result in a determination of a defect in the physical chip that may explain the differences in the test results of the physical test and the simulation. The diagnosing may be based on tracing through the design 322. The tracing may determine a subset of logic likely containing a defect which could have caused the error in the physical test result. The diagnosing may be based on design rule checking 324. The design rules may be checked in the subset of logic to find areas that violate design rules or are very close to violating design rules.

One or more faults may be inserted into the logic to emulate the effects of a defect. A fault may be a short between two nodes that are supposed to be isolated, an open circuit that is supposed to be connected, a transistor that is non-operational, or any other type of fault. Simulation may be performed on the truncated netlist of the subset of logic with the one or more faults inserted. The results of the simulation with the fault(s) inserted may then be compared to the physical test results and if the results are the same, the inserted fault may represent the defect in the physical chip. Various steps in the flow 300 may be changed in order, repeated, omitted, or the like without departing from the disclosed concepts. Various embodiments of the flow 300 may be included in a computer program product embodied in a non-transitory computer readable medium that includes code executable by one or more processors.

Figure 4:
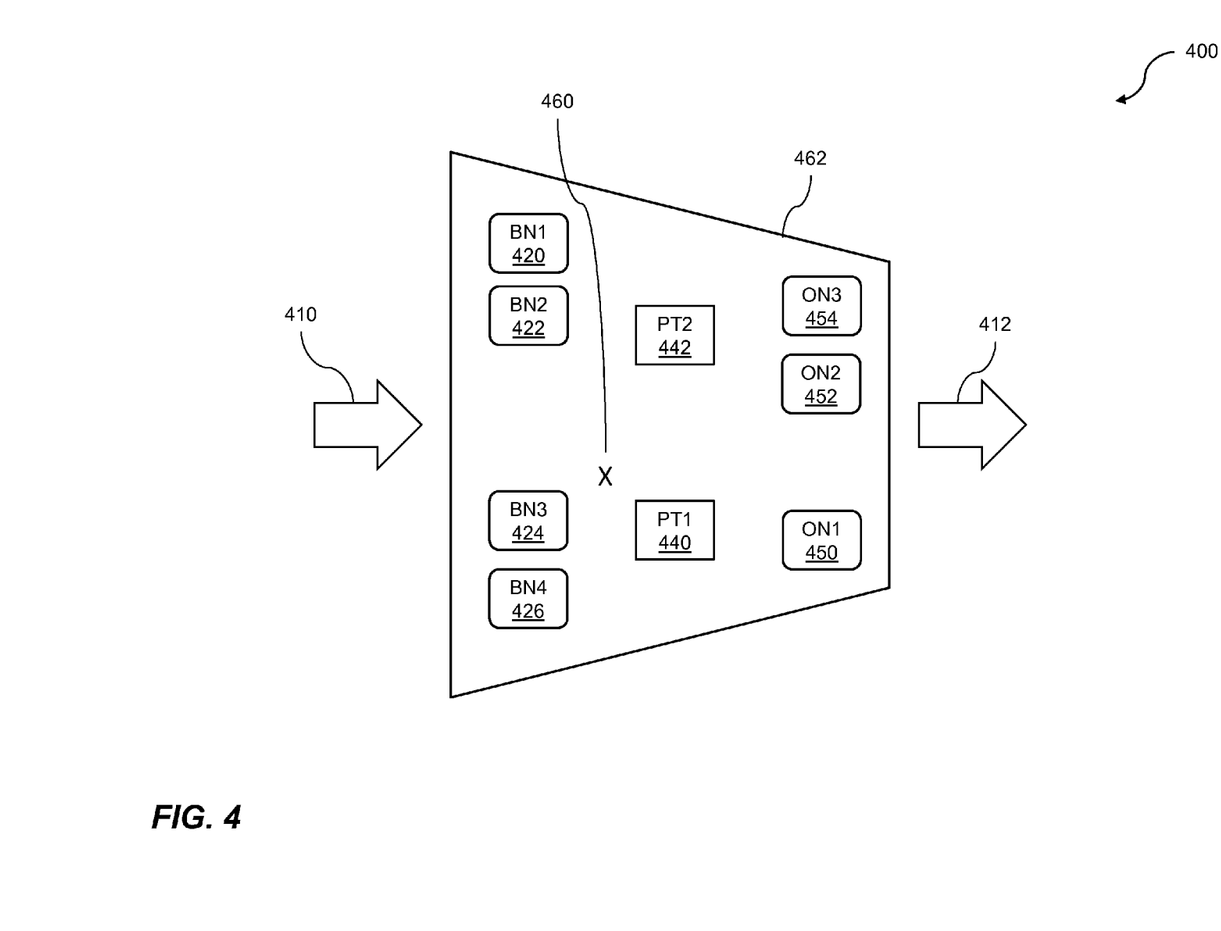
FIG. 4 is an example logic diagram with a subset of logic.

FIG. 4 is an example logic diagram with a subset of logic. The subset of logic 400 can include a plurality of circuits including logic gates. Some embodiments may include additional logic while others may not include some of the circuit blocks shown in 400. The plurality of gates may represent a subset of gates 462 present in a design. Subsets of gates may be calculated and stored a priori to simulation, in cases where such pre-computation may improve computational efficiency of the simulation. One or more subsets of logic gates may be simulated as part of a verification process, for example. A simulation of a subset of gates may produce a failure resulting from a test pattern that was applied to the subset of gates. The simulation of the subset of logic gates may reduce computational requirements including CPU time and required memory by examining only the gates in a cone or subset of logic displaying the failure. The failure may present in more than one cone of logic. The simulation of a subset of logic gates may replace full-design good-machine simulation with truncated simulation on the subset of the design. Results from one failing pattern may require that a good-machine simulation be performed on only a small subset of gates while in other instances more than one subset may be examined. A union of subsets of gates required by multiple simulation patterns may result in only a small subset of the gates required for simulation. As a result, parallel-pattern simulation may be applied.

The failing simulation patterns may result from one or more defects. An example defect 460 may result from a variety of sources including a manufacturing defect. A subset of logic gates may contain one or more defects such as example defect 460. A defect may be present in one or more subsets of logic gates. Identifying a defect may require simulation of one or more subsets of logic gates when, for example, the defect is contained within a plurality of subsets. The subsets may include truncated subsets. Simulation, including truncated simulation, may include performing good-machine simulation on one or more subsets of gates.

Truncated good-machine simulation may include identifying boundary nodes such as BN1 420, BN2 422, BN3 424, and BN4 426. The identifying may be part of a list pre-calculation step. Any number of boundary nodes may be identified in a subset of logic. The subset of the logic may be fed by a stimulus point in the design which can be one of these boundary nodes. The stimulus point can include a primary input or a scan cell. Boundary nodes within a subset or cone of logic gates containing a defect may be initialized with various, appropriate numbers including test vectors or other inputs 410. Boundary nodes of the subset of logic blocks may be initialized in order to test for the defect 460. The boundary nodes may include scannable cells. When boundary nodes are scannable, then load compressor output values relating only to the boundary cells may be calculated. Gates in a truncated gate list may be rank-ordered for simulation. The rank order may describe the order in which gates in the truncated gate list are simulated to ensure simulation integrity.

A truncated subset may include pass-through nodes such as PT1 440 and PT2 442. Any number of pass-through cells may be identified in the subset of logic. Pass-through cells may be state elements such as D-latches and D-flipflops. State elements which may have the potential to capture new behavior or values in a simulation step are put on a pass-through cell list. The captured behavior or values may be of interest because they may represent a value or values which may then affect one or more other values being captured in the same simulation cycle. Pass-through cells that are not transparent latches are placed on the boundary cell list.

The truncated subset may include observe nodes such as ON1 450, ON2 452, and ON3 454. Any number of observe nodes may be identified in the subset of logic. The observe nodes may include nodes of a subset of logic at which simulation results may be observed. So-called trace back paths from the observe nodes are identified. The trace back paths are identified such that a gate may only be traced once. The observe nodes may have a path back through the subset of logic to the boundary nodes. Output data or test results 412, for example, from one or more observe nodes may be examined as part of an analysis step. The analysis step may be part of a simulation, for example. The observe nodes may be scannable.

Figure 5:
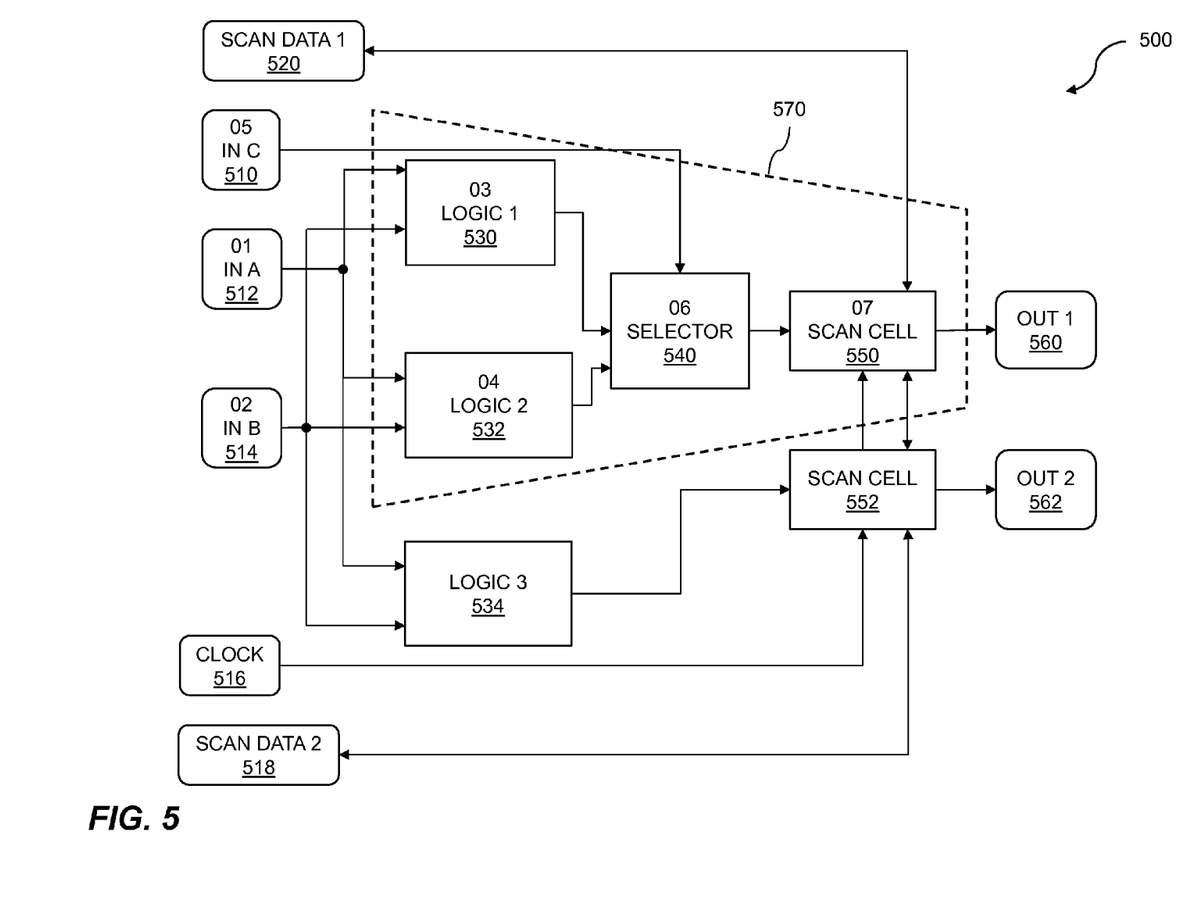
FIG. 5 is an example logic diagram with a truncated rank-ordered list.

FIG. 5 is an example logic diagram with a truncated rank-ordered list. A logic subset or cone 570 can include a subset of logic gates from a larger set of gates 500. The logic gates can include simple logic functions such as NANDs, NORs and XORs, and may include higher level logic functions such as adders, multipliers, selectors, and so on. The logic gates may be connected to various input, output, and control signals. For example, inputs may include IN A 512, and IN B 514, and various test data signals including Scan Data 1 520 and Scan Data 2 518. The subset of logic 570 can feed an observation point in the design, such as OUT 1 560. In this example design, the outputs may include OUT 1 560 and OUT 2 562 but only OUT 1 560 is fed by the subset of logic 570. In some embodiments, the observation point includes a primary output for a semiconductor chip. In other embodiments, the observation point is reached through compression logic where the compression logic aids in ATPG testing of the semiconductor. Control signals may include IN C 510, Clock 516, and so on. In embodiments, inputs, outputs, and controls may be scannable. A logic subset may contain one or more logic gates, one or more observe points, and so on. A cone may be identified because of a failed pattern from a test, simulation, or verification step. One or more cones may be related to a single failed pattern, or a single cone may be related to multiple failed patterns. A logic subset may be any size convenient to encapsulate or surround one or more failed patterns. An example logic subset or cone 570 may contain various logic blocks related to a failed pattern. For example, the logic subset 570 may contain Logic 1 530, Logic 2 532, Selector 540, and Scan Cell 550. The logic subset may include one or more observe points, where the observe points may be, for example, scan cells, flop-flops, or latches. Gates in the cone may traced back from an observe cell such that each gate is only traced once. In practice, any number of gates convenient to analysis may be contained in a given cone. For example, cone 570 might be expanded to include Scan Cell 552 and block Logic 3 534. Again, inclusion or exclusion of a particular logic gate or block may be chosen for convenience of analysis.

Gates contained within one or more logic subsets may be tested, simulated, verified, and so on. Gates may be rank ordered as part of a test, simulation, or verification technique, for example. Rank ordering of the gates may determine the order in which gates may be simulated in order to ensure proper simulation of one or more blocks of logic. For example, again consider logic subset 570. In order for a simulation of one or more blocks contained within a block of logic to proceed, inputs to the block must be set up and established as valid prior to that simulation step. Continuing the example, in order to simulate the block Logic 1 530, the inputs to that block, inputs IN A 512 and IN B 514 must first be valid. The inputs In A 512 and In B 514 may be assigned rank numbers, for example 01 for In A and 02 for In B. Blocks 01 and 02 may then appear higher in a ranked list. The logic blocks are next considered. Logic 1 may be assigned a rank 03, and Logic 2 assigned a rank 04. Logic blocks Logic 1 03 and Logic 2 04 may then be added to the ranked ordered list. The example continues with the control input In C 510. The signal In C is an input to Selector 540, so it must be valid before the Selector 540 may be simulated. In C may be assigned a rank number 05 and may then be placed on the ranked ordered list. Selector 540 may next be assigned a rank number of 06 and may then be placed on the ranked ordered list. Continuing the example, Scan Cell 550 may be assigned a rank number 07 and may then be placed on the ranked ordered list. Another control signal Clock 516 may be triggered as part of a simulation process. When the clock signal is triggered, test, simulation, or verification results may be captured in Scan Cell 550. From the Scan Cell, captured data may be transferred to an output, for example, Out 1 560, scanned out using a scan data port, for example Scan Data 1 520 or Scan Data 2 518, or observed through some other appropriate technique. An example ranked ordered list for the example described would be:

| Rank Number | Item |
|---|---|
| 01 | IN A 512 |
| 02 | IN B 514 |
| 03 | LOGIC 1 530 |
| 04 | LOGIC 2 532 |
| 05 | IN C 510 |
| 06 | SELECTOR 540 |
| 07 | SCAN CELL 550 |

Items in the ranked ordered list may be tested, simulated, or verified in the order described. The order of the ranked ordered list is significant. Simulation in a rank order allows earlier gates in a logic subset to be evaluated before later gates. By determining a subset, i.e. a truncated portion of a design, and a rank order of that subset, a truncated rank order simulation can be performed.

Figure 6:
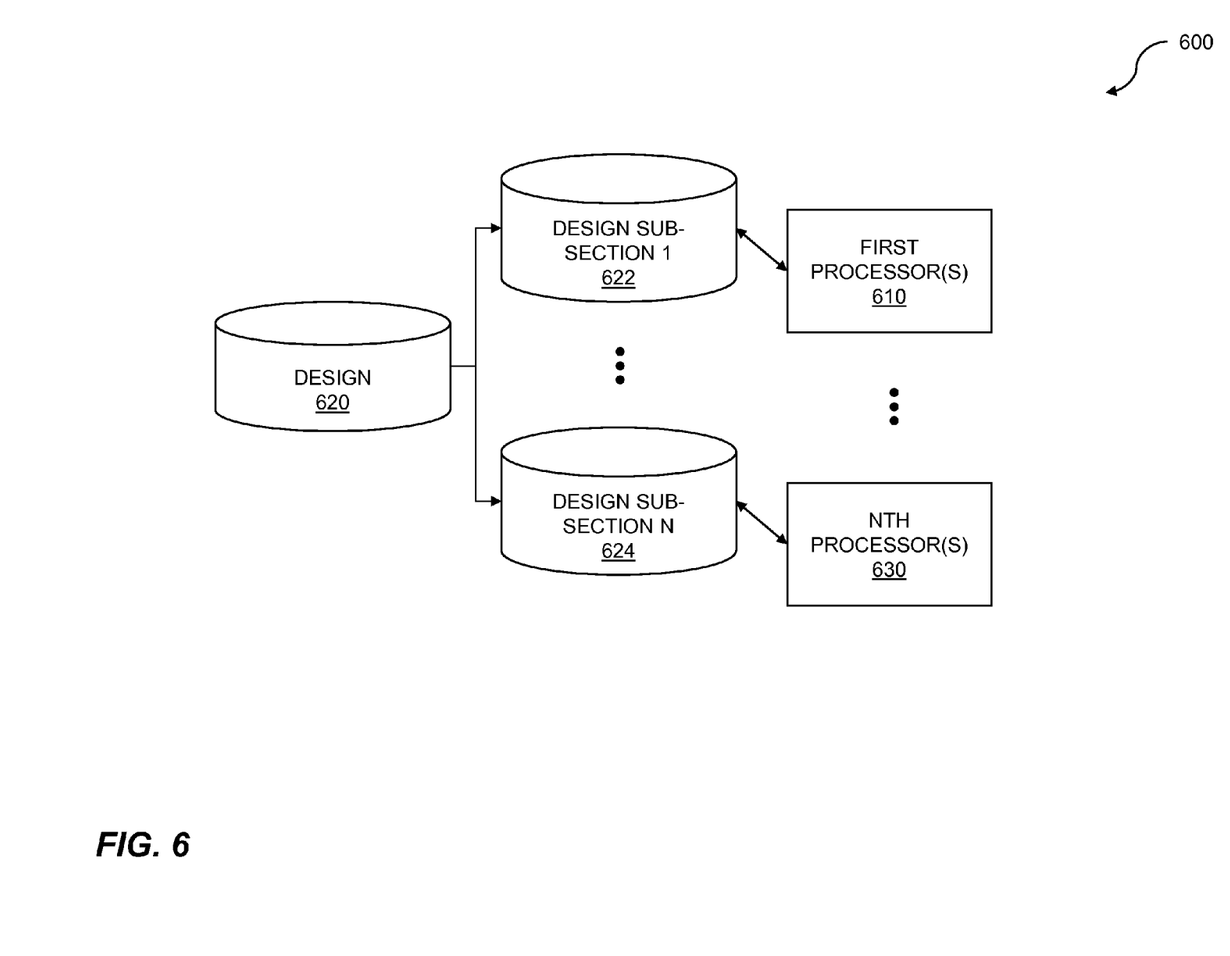
FIG. 6 is a system diagram for good-machine simulation.

FIG. 6 is a system diagram for good-machine simulation. The system 600 includes a computer readable storage medium 620 to store the design. Various subsections of the design can be pre-calculated and stored. A first design subsection that is stored may be simulated with a first pattern on a computer readable storage medium 622 and a second design subsection that is stored may be simulated with another pattern on a computer readable storage medium 624. Numerous pre-calculated subsections of the design may be simulated on numerous storage memory elements.

A first group of one or more processors 610, coupled to the computer readable storage medium 622, can perform good-machine simulation on a cone of logic using the first design subsection for a first pattern. The first group of one or more processors 610 can read the pre-calculated subsection from the computer readable storage medium 622. That logic subsection of interest can be initialized based on a pattern so that that subsection can be simulated. A second group of one or more processors 630, coupled to the computer readable storage medium 624, may perform good-machine simulation on a second subset of logic using a second pattern. The second group of processors 630 may read the pre-calculated subsection of a design from the computer readable storage medium 624. The second subsection of logic can be initialized based on a pattern so that that subsection can be simulated. So, the performing of good-machine simulation on the first subset of logic and the performing of good-machine simulation on another subset of logic can be accomplished in parallel. Any number of subsections can be evaluated in parallel, as indicated in the figure by the evaluation of subsection 1 622 through subsection N 624 where "N" represents some number larger than one.

Figure 7:
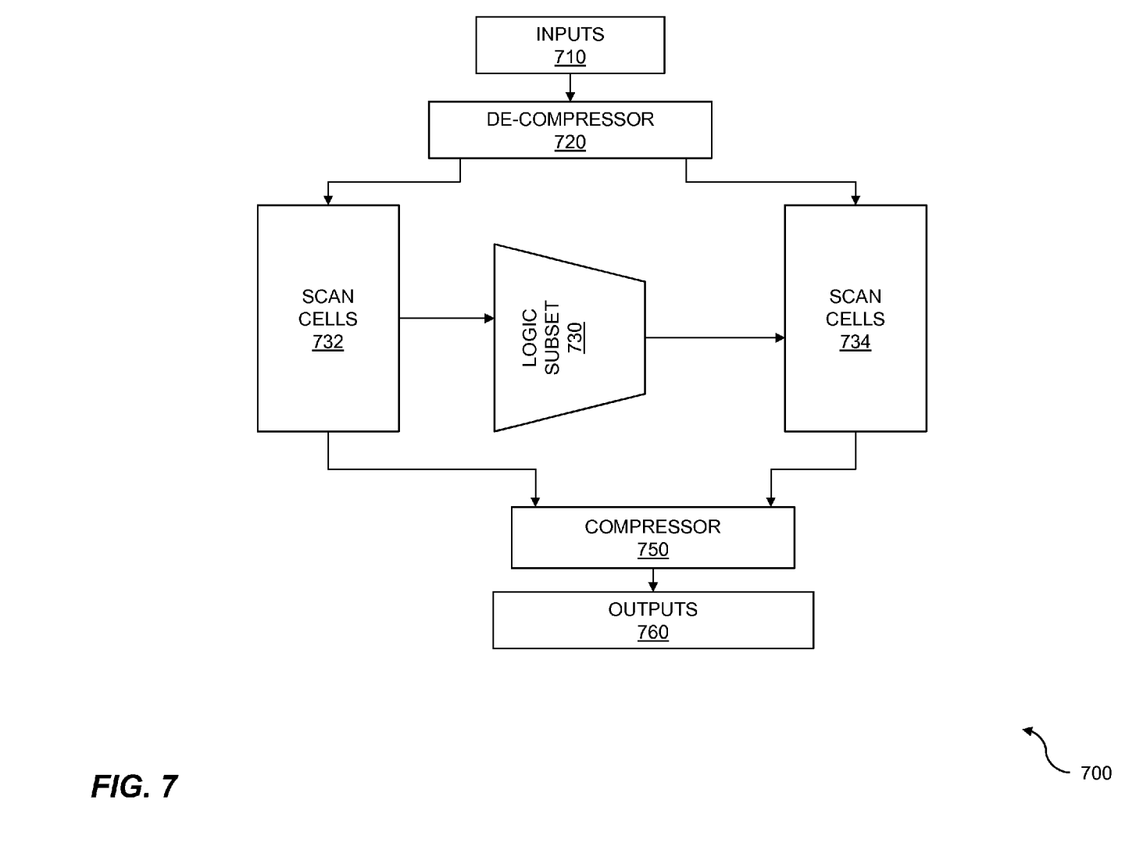
FIG. 7 is an example block diagram of a chip with compression.

FIG. 7 is an example block diagram of a chip with compression. A chip design 700 may include any number of logic blocks along with inputs 710 to the design 700. The inputs 710 can be connected to a decompression block 720. The decompression can expand or decompress the values from the inputs 700 into other values appropriate for test, simulation, verification, and other purposes. The decompressed values may include more bits than the input values. The decompression may be accomplished by any appropriate technique including XOR trees. The decompressed values may be fed into various scan cells, for example, Scan Cells 732 and Scan Cells 734. The decompressed values, which have been scanned into the scan cells 732 can then be used as inputs including test inputs to a Logic Subset 730. The Logic Subset 730 may include combinational logic, sequential logic, and so on. The Scan Cells 734 may then capture the outputs of Logic Subset 730.

The various scan cells, including, for example, Scan Cells 732 and Scan Cells 734, may be connected to a compressor block 750. The compressor block 750 can take as input values from the scan cells. The values from the scan cells can include test, simulation, or verification results, for example. The results of compression by Compressor 750 can be fed to one or more chip outputs 760. The outputs can then be analyzed for test, simulation, and verification purposes. The logic subset 730 can be considered an example truncated portion of a design and simulation performed on the truncated portion in rank order using the decompression, scan cells, and compression circuitry to aid in automated test pattern generation (ATPG) semiconductor testing.

Figure 8:
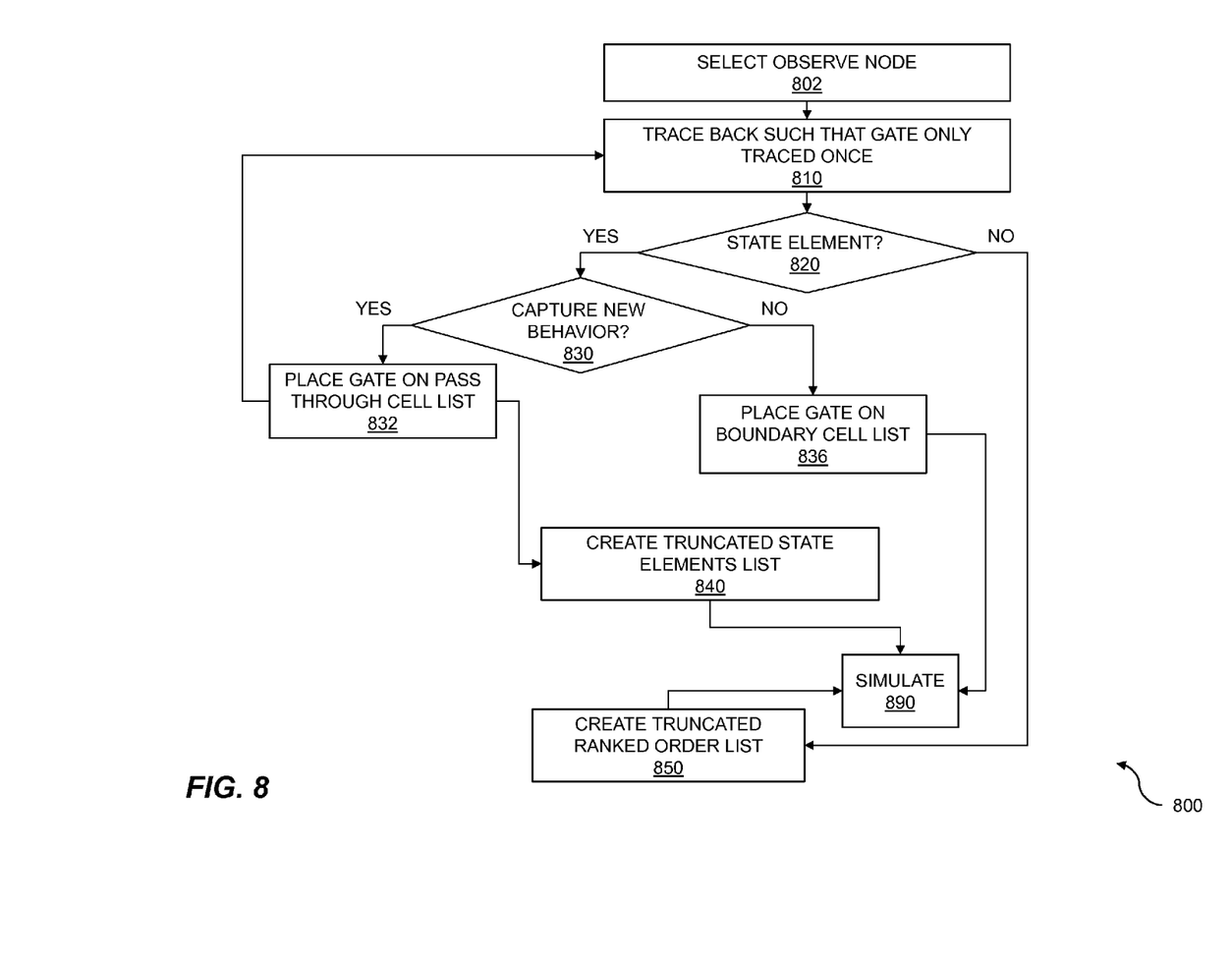
FIG. 8 is a flow diagram for analysis of patterns with a single clock cycle.

FIG. 8 is a flow diagram for analyzing patterns with a single clock cycle. The flow 800 describes a computer-implemented technique for pre-calculating truncated ranked-ordered gate lists for one-clock cycle patterns. The flow 800 includes selecting observe nodes 802 within a design for evaluation. The node or nodes could be failing nodes based on a failure seen on a physical semiconductor chip. The node or nodes could be for evaluating possible failures. The flow 800 includes tracing back from the selected observe nodes such that a gate within a subset of gates may only be traced once 810. The tracing may be part of a test, simulation, verification, or other technique. The subset of gates may be included in a trace back list where the gates comprise combinational and/or state element gates. If the gate of interest on the trace back list is a state element 820, then it may be examined further to determine whether the state element may capture new behavior 830. The new behavior captured by a state element can influence values being captured by other state elements; in some instances it can be in the same simulation cycle. The order in which behavior is captured can be critical to successful test, simulation, verification, and so on. If no new behavior is captured by a particular state element, then that element is placed on a boundary cell list 836. If the new behavior can be captured by a particular state element, then the particular element is placed on a pass through cell list 832.

A truncated ranked order list can be created 850 that includes gates in a subset of logic that are not state elements. A truncated list of state elements can be created 840 that includes a list of pass through gates and a list of selected observe nodes from the selecting 802. The truncated state elements list and the truncated rank order list as well as the boundary cell list can be used to simulate 890 the logic subset. Various steps in the flow 800 may be changed in order, repeated, omitted, or the like without departing from the disclosed concepts. Various embodiments of the flow 800 may be included in a computer program product embodied in a non-transitory computer readable medium that includes code executable by one or more processors.

Figure 9:
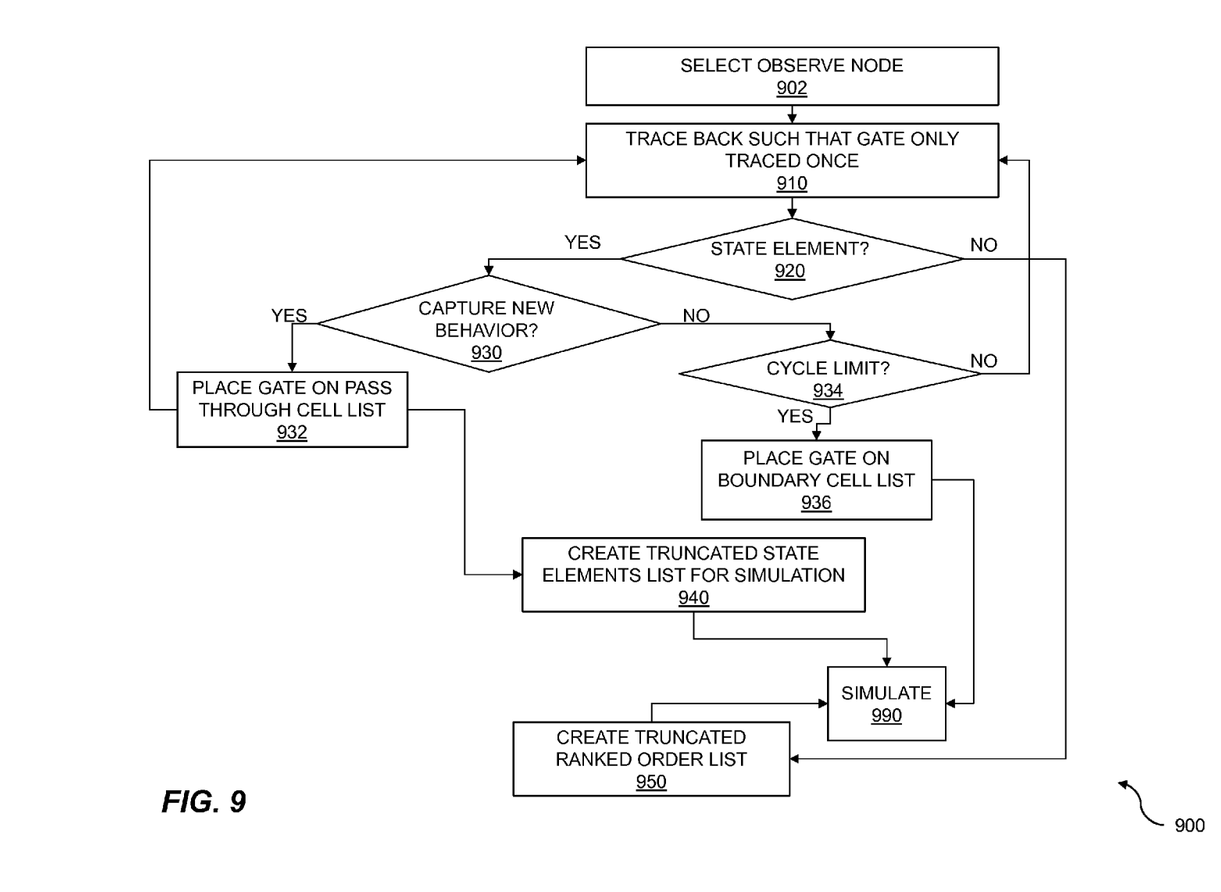
FIG. 9 is a flow diagram for analysis of patterns with two or more clock cycles.

FIG. 9 is a flow diagram for analyzing patterns with two or more clock cycles. The flow 900 describes a computer-implemented technique for pre-calculating truncated ranked-ordered gate lists for one-clock cycle patterns. The pre-calculating for the two-clock cycle patterns may be a continuation of the calculating for a one-clock pattern flow 800 or an independent flow. The flow 900 includes selecting observe nodes 902 within a design for evaluation. The node or nodes could be failing nodes based on a failure seen on a physical semiconductor chip. The node or nodes could be for evaluating possible failures. The flow 900 includes tracing back from the selected observe nodes such that a gate within a subset of gates may only be traced once 910. If the gate of interest on the trace back list is a state element 920, then it may be examined further to determine whether the state element may capture new behavior 930. The new behavior captured by a state element can influence values being captured by other state elements. If no new behavior is captured by a particular state element, then an evaluation of a cycle limit 934 can be performed. If the limit has been reached then that element is placed on a boundary cell list 936. If the cycle limit has not been reached then tracing back 910 continues. For a two-cycle pattern the checking of cycle limits 934 is performed once. If a three-cycle pattern is being evaluated, the checking of cycle limits is performed twice. As the cycle pattern count increases, the number of time the checking of cycle limits 934 is increased accordingly.

If the new behavior can be captured by a particular state element, then the particular element is placed on a pass through cell list 932. A truncated ranked order list can be created 950 that includes gates in a subset of logic that are not state elements. A truncated list of state elements can be created 940 that includes a list of pass through gates and a list of selected observe nodes from the selecting 902. The truncated state elements list and the truncated rank order list as well as the boundary cell list can be used to simulate 990 the logic subset. Various steps in the flow 900 may be changed in order, repeated, omitted, or the like without departing from the disclosed concepts. Various embodiments of the flow 900 may be included in a computer program product embodied in a non-transitory computer readable medium that includes code executable by one or more processors.

Figure 10:
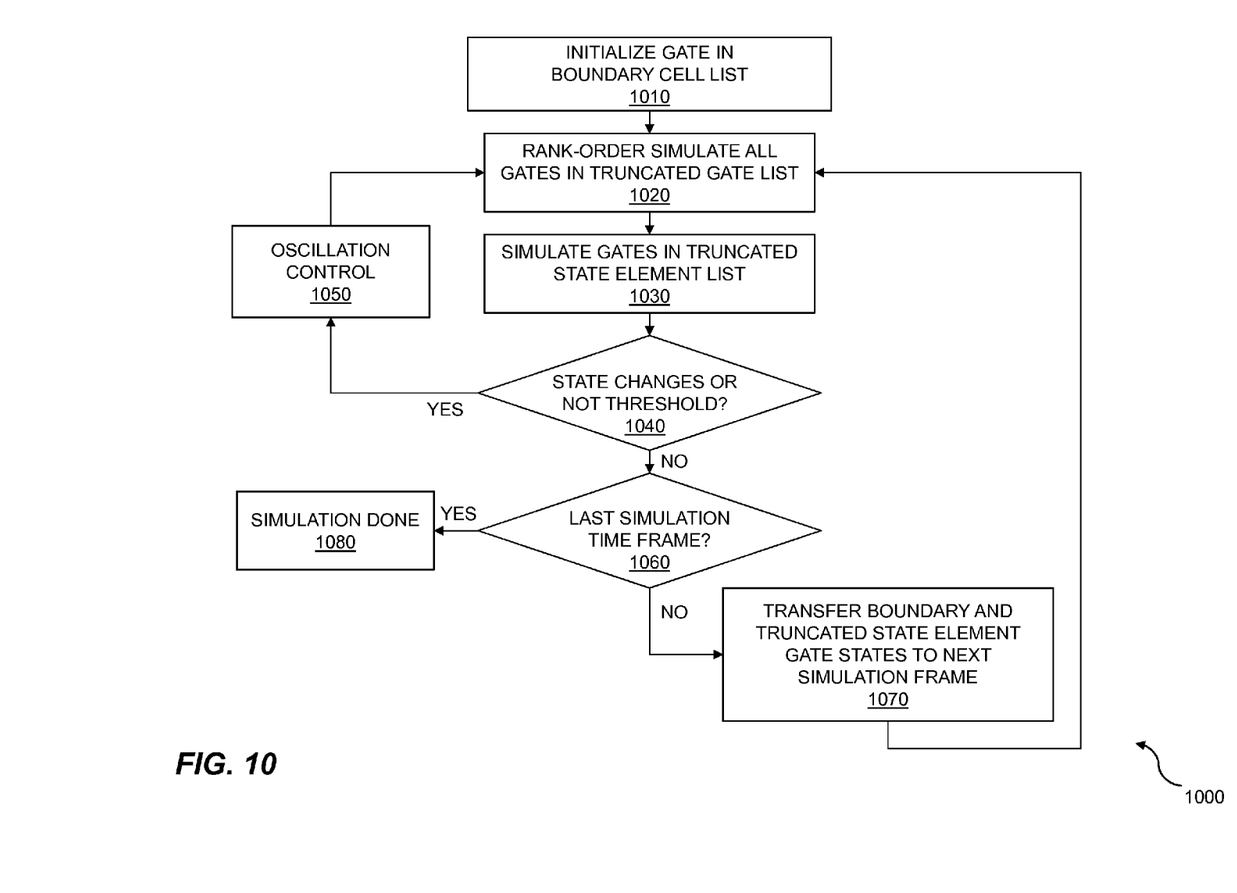
FIG. 10 is a flow diagram for truncated simulation.

FIG. 10 is a flow diagram for performing truncated simulation. A flow 1000 describes a computer-aided technique for performing the truncated simulation. The flow 1000 includes initializing the gates in the boundary cell list 1010. The gates can be initialized with any appropriate values including states, input values, simulation values, and so on. The flow continues with rank-order simulation of all gates in the truncated gate list 1020. The order in which the gates are listed in the truncated gate list is significant to the successful simulation of the gates. It is important that the inputs to a gate of interest arrive before simulation of that gate. The flow continues with simulating through the various gates in the truncated state element list 1030. It is understood that state elements in the truncated state element list may change state as a result of the simulation. The gates which change state are noted for further consideration. List order simulation of gates in the truncated gate list, and simulation of gates in the truncated state element list are repeated until there are no state element changes or until a maximum activity levels is reached 1040. If state changes occur and if maximum activity levels are not reached, oscillation control is applied 1050. Oscillation control may be applied locally to gates of interest. The flow continues with determining whether the last simulation time frame has been reached 1060. If the last simulation time frame has been reached, then simulation of the current gate concludes 1080. Otherwise, the flow continues with transferring of boundary and truncate state element gate states to the beginning of the next simulation time frame 1070. Various types of information are transferred, including a list of gates, state changes of various gates, test information, and so on. The flow continues by returning to list-order simulation of all gates in the truncated gate list 1020. Simulation continues until all gates have been through simulation, no state changes occur, and all simulation steps have been considered. The simulation is accomplished using rank order so that earlier stages in a subsection of logic are simulated before later stages. Various steps in the flow 1000 may be changed in order, repeated, omitted, or the like without departing from the disclosed concepts. Various embodiments of the flow 1000 may be included in a computer program product embodied in a non-transitory computer readable medium that includes code executable by one or more processors.

Figure 11:
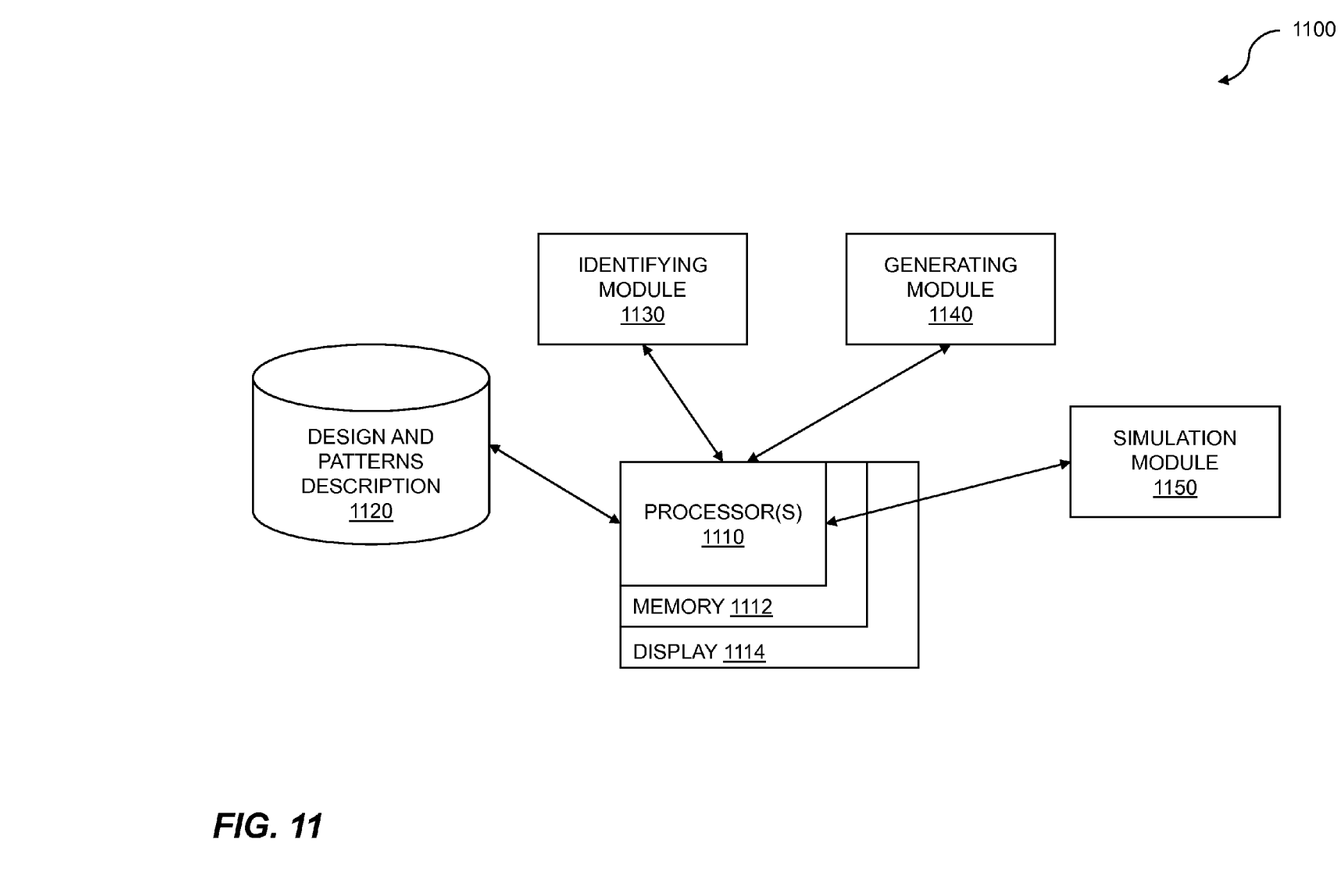
FIG. 11 is a system diagram for diagnosis and debug using truncated simulation.

FIG. 11 is a diagram of an example system that facilitates diagnosis and debug using truncated simulation. The system 1100 includes one or more processors 1110 coupled to memory 1112 which may be used to store computer code instructions and/or data, such as design information, pre-calculated logic subsections, truncated netlists, physical chip test information, test patterns, and the like. A display 1114 may also be included which can be any electronic display, including but not limited to, a computer display, a laptop screen, a net-book screen, a tablet screen, a cell phone display, a mobile device display, a remote with a display, a television, a projector, or the like. Design and pattern descriptions 1120 can be stored on a computer disk or other computer storage medium. An identifying module 1130 can be included in the system 1100 to identify a subset of logic within the design based on the one or more patterns which cause the physical chip to fail in operation. A generating module 1140 can be included in the system 1100 to generate a truncated rank-ordered list based on the subset of logic. A simulation module 1150 may be included in the system 1100 to perform good-machine simulation on the subset of logic using the one or more patterns. In at least one embodiment, the functions of the identifying module 1130, the generating module 1140, and/or the simulation module are accomplished by the one or more processors 1110.

The system 1100 may include a computer program product embodied in a non-transitory computer readable medium for design analysis. The computer program product can include code for obtaining a design and patterns used to test the design; code for determining one or more of the patterns which cause a physical semiconductor chip, based on the design, to fail in operation; code for identifying a subset of logic within the design based on the one or more patterns which cause the physical chip to fail in operation; code for generating a truncated rank-ordered list based on the subset of logic; and code for performing good-machine simulation on the subset of logic using the one or more patterns and the truncated rank-ordered list.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
    determining one or more of the patterns, from patterns used to test a semiconductor design, which cause a physical semiconductor chip, based on the semiconductor design, to fail in operation;
    identifying a subset of logic within the design where the fail occurred based on the one or more patterns which cause the physical semiconductor chip to fail in operation;
    generating a truncated rank-ordered list of nodes and logic based on the subset of logic, wherein the truncated rank-ordered list includes a list of observe nodes and pass-through cells, where the list of pass-through cells includes state elements which data passes through during application of the one or more patterns; and
    performing good-machine simulation on the subset of logic using the one or more patterns and the truncated rank-ordered list.

2. The method of claim 1 wherein the truncated rank-ordered list includes a truncated state elements list comprising the list of selected observe nodes and the list of pass-through cells.

3. The method of claim 1 wherein the truncated rank-ordered list further includes a list of boundary cells where the list of boundary cells includes stimulus points used by the one or more patterns.

4. The method of claim 1 wherein the good-machine simulation is performed using rank order simulation based on the truncated rank-ordered list.

5. The method of claim 4 wherein multiple passes of the rank order simulation are performed where the subset of logic includes a feedback path.

6. The method of claim 1 wherein the physical semiconductor chip has a defect which causes the one or more patterns to fail on the physical semiconductor chip.

7. The method of claim 6 wherein the good-machine simulation passes when the one or patterns are applied to the design.

8. The method of claim 1 further comprising storing information on the subset of logic along with the one or more patterns.

9. The method of claim 1 further comprising comparing the good-machine simulation with test results from the physical semiconductor chip.

10. The method of claim 9 further comprising diagnosing a failure on the physical semiconductor chip based on the comparing.

11. The method of claim 10 wherein the diagnosing is based on tracing through the design.

12. The method of claim 1 wherein the subset of logic feeds an observation point in the design.

13. The method of claim 12 wherein the observation point includes a primary output.

14. The method of claim 12 wherein the observation point includes a scan cell.

15. The method of claim 12 wherein the observation point is reached through compression logic.

16. The method of claim 1 wherein the subset of logic is fed by a stimulus point in the design.

17. The method of claim 16 wherein the stimulus point includes a primary input.

18. The method of claim 16 wherein the stimulus point includes a scan cell.

19. The method of claim 16 wherein the stimulus point feeds logic including compression logic.

20. The method of claim 1 wherein the patterns include a one-cycle pattern.

21. The method of claim 1 wherein the patterns include a two-cycle pattern.

22. The method of claim 1 further comprising pre-calculating a subset of gates within the design based on a pattern within the patterns.

23. The method of claim 22 wherein the subset of gates includes pass-through cells, selected observe nodes, and boundary cells and where the pass-through cells, observe nodes, and boundary cells are included in the truncated rank-ordered list and where the good-machine simulation is performed using rank order simulation based on the truncated rank-ordered list.

24. The method of claim 22 further comprising storing the subset of gates along with pattern results from the pre-calculating.

25. The method of claim 1 wherein the performing good-machine simulation includes initializing a subset of gates within the design.

26. A computer system for design analysis comprising:
a memory which stores instructions;
one or more processors coupled to the memory wherein the one or more processors are configured to:
 determine one or more of the patterns, from patterns used to test a semiconductor design, which cause a physical semiconductor chip, based on the semiconductor design, to fail in operation;
 identify a subset of logic within the design where the fail occurred based on the one or more patterns which cause the physical semiconductor chip to fail in operation;
 generate a truncated rank-ordered list of nodes and logic based on the subset of logic, wherein the truncated rank-ordered list includes a list of observe nodes and pass-through cells, where the list of pass-through cells includes state elements which data passes through during application of the one or more patterns; and
 perform good-machine simulation on the subset of logic using the one or more patterns and the truncated rank-ordered list.

27. The computer system of claim 26 wherein the good-machine simulation is performed using rank order simulation based on the truncated rank-ordered list.

28. The computer system of claim 26 further comprising comparing the good-machine simulation with test results from the physical semiconductor chip and diagnosing a failure on the physical semiconductor chip based on the comparing, wherein the diagnosing is based on tracing through the design.

29. The computer system of claim 26 further comprising pre-calculating a subset of gates within the design based on a pattern within the patterns.

30. A computer program product embodied in a non-transitory computer readable medium for design analysis comprising:
code for determining one or more of the patterns, from patterns used to test a semiconductor design, which cause a physical semiconductor chip, based on the semiconductor design, to fail in operation;
code for identifying a subset of logic within the design where the fail occurred based on the one or more patterns which cause the physical semiconductor chip to fail in operation;
code for generating a truncated rank-ordered list of nodes and logic based on the subset of logic, wherein the truncated rank-ordered list includes a list of observe nodes and pass-through cells, where the list of pass-through cells includes state elements which data passes through during application of the one or more patterns; and
code for performing good-machine simulation on the subset of logic using the one or more patterns and the truncated rank-ordered list.

31. The computer program product of claim 30 wherein the good-machine simulation is performed using rank order simulation based on the truncated rank-ordered list.

32. The computer program product of claim 30 further comprising code for comparing the good-machine simulation with test results from the physical semiconductor chip and diagnosing a failure on the physical semiconductor chip based on the comparing, wherein the diagnosing is based on tracing through the design.

33. The computer program product of claim 30 further comprising code for pre-calculating a subset of gates within the design based on a pattern within the patterns.

* * * * *